United States Patent
Isogai et al.

(10) Patent No.: US 12,029,106 B2
(45) Date of Patent: Jul. 2, 2024

(54) n-TYPE SEMICONDUCTOR ELEMENT, METHOD FOR MANUFACTURING n-TYPE SEMICONDUCTOR ELEMENT, WIRELESS COMMUNICATION DEVICE, AND MERCHANDISE TAG

(71) Applicant: Toray Industries, Inc., Tokyo (JP)

(72) Inventors: Kazuki Isogai, Otsu (JP); Yasuhiro Kobayashi, Otsu (JP); Seiichiro Murase, Otsu (JP)

(73) Assignee: Toray Industries, Inc., Tokyo (JP)

( * ) Notice: Subject to any disclaimer, the term of this patent is extended or adjusted under 35 U.S.C. 154(b) by 403 days.

(21) Appl. No.: 17/441,335

(22) PCT Filed: Mar. 6, 2020

(86) PCT No.: PCT/JP2020/009668
§ 371 (c)(1),
(2) Date: Sep. 21, 2021

(87) PCT Pub. No.: WO2020/195707
PCT Pub. Date: Oct. 1, 2020

(65) Prior Publication Data
US 2022/0185951 A1    Jun. 16, 2022

(30) Foreign Application Priority Data

Mar. 26, 2019  (JP) ................................. 2019-058130
Mar. 26, 2019  (JP) ................................. 2019-058131

(51) Int. Cl.
*H10K 85/20*    (2023.01)
*H10K 10/46*    (2023.01)
*H10K 10/88*    (2023.01)

(52) U.S. Cl.
CPC ........... *H10K 85/221* (2023.02); *H10K 10/46* (2023.02); *H10K 10/484* (2023.02); *H10K 10/88* (2023.02)

(58) Field of Classification Search
CPC ......... H10K 10/484–488; H10K 10/88; H10K 85/221
See application file for complete search history.

(56) References Cited

U.S. PATENT DOCUMENTS 10,615,352 B2    4/2020  Shimizu et al.
2020/0035925 A1*  1/2020  Isogai ............... H01L 21/02216

FOREIGN PATENT DOCUMENTS

JP    2009283924 A    12/2009
JP    2017016820 A    1/2017
(Continued)

OTHER PUBLICATIONS

Klinke, Christian et al. "Charge Transfer Induced Polarity Switching in Carbon Nanotube Transistors", ARXIV.org, Cornell University Library, Cornell University, Ithaca, NY, Mar. 13, 2006, 4 pages, XP080229954. (Year: 2006).*

(Continued)

*Primary Examiner* — Daniel P Shook
(74) *Attorney, Agent, or Firm* — Buchanan Ingersoll & Rooney PC

(57) ABSTRACT

An object of the present invention is to provide a n-type semiconductor element having improved n-type semiconductor characteristics and excellent stability, where the n-type semiconductor element includes a second insulating layer, where the second insulating layer contains: A. (a) a compound having one carbon-carbon double bond or one conjugated system bound to at least one group represented by general formula (1) and at least one group represented by (Continued)

general formula (2); and (b) a polymer; or B. a polymer having, in its molecular structure, the remaining group after removing some hydrogen atoms from $R^1$, $R^2$, $R^3$, or $R^4$ in the compound (a), or the remaining group after removing some hydrogen atoms from the carbon-carbon double bond or the conjugated system in the compound (a).

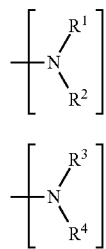

(1)

(2)

14 Claims, 3 Drawing Sheets

(56) References Cited

FOREIGN PATENT DOCUMENTS

| WO | 2017130836 A1 | 8/2017 | |
| WO | 2018180146 A1 | 10/2018 | |
| WO | WO2018/180146 A1 * | 10/2018 | ......... H01L 51/0558 |

OTHER PUBLICATIONS

International Search Report and Written Opinion of the International Searching Authority for International Application No. PCT/JP2020/009668, dated Jun. 2, 2020, 5 pages.

Klinke et al., "Charge transfer induced polarity switching in carbon nanotube transistors", ARXIV.org, Cornell University Library, Cornell University, Ithaca, NY, Mar. 13, 2006, 4 pages, XP080229954.

Schneider et al., "Efficient n-doping and hole blocking in single-walled carbon nanotube transistors with 1,2,4,5-tetrakis (tetramethylguanidino)ben-zene", ACS Nano, vol. 12(6), May 22, 2018, pp. 5895-5902, XP055911633.

Extended European Search Report for European Application No. 20 778 327.5, dated Apr. 25, 2022, 9 pages.

* cited by examiner n-TYPE SEMICONDUCTOR ELEMENT, METHOD FOR MANUFACTURING n-TYPE SEMICONDUCTOR ELEMENT, WIRELESS COMMUNICATION DEVICE, AND MERCHANDISE TAG

CROSS REFERENCE TO RELATED APPLICATIONS

This is the U.S. National Phase application of PCT/JP2020/009668, filed Mar. 6, 2020, which claims priority to Japanese Patent Application No. 2019-058130, filed Mar. 26, 2019 and Japanese Patent Application No. 2019-058131, filed Mar. 26, 2019, the disclosures of these applications being incorporated herein by reference in their entireties for all purposes.

FIELD OF THE INVENTION

The present invention relates to n-type semiconductor elements and methods of manufacturing the same, and to wireless communication devices and merchandise tags using the n-type semiconductor elements.

BACKGROUND OF THE INVENTION

In recent years, wireless communication systems based on RFID (Radio Frequency IDentification) technology have attracted attention. RFID tags have an IC chip with a circuit composed of a field effect transistor (hereinafter referred to as "FET"), and an antenna for wireless communication with a reader/writer. The antenna installed in the tag receives the carrier wave transmitted from the reader/writer, and the driving circuit in the IC chip operates.

RFID tags are expected to be used in various applications, such as physical distribution management, product management, and shoplifting prevention, and have begun to be introduced in some IC cards such as transportation cards, and merchandise tags.

In order to allow RFID tags to be used in a wider variety of products in the future, it is necessary to reduce the manufacturing costs. For that, it is under investigation, in the manufacturing process of RFID tags, to depart from processes using vacuum and high temperatures, and to use flexible and inexpensive processes using coating and printing technologies.

For transistors in driving circuits in IC chips, for example, field effect transistors using carbon nanotubes (CNTs) and organic semiconductors, which can be applied to ink-jet and screen-printing technologies, are being actively investigated.

Incidentally, driving circuits in IC chips generally comprises a complementary circuit composed of p-type FETs and n-type FETs in order to, for example, reduce the power consumption. However, it is known that FETs using CNTs (hereinafter referred to as "CNT-FETs") usually exhibit the characteristics of p-type semiconductor elements in the atmosphere. Thus, it has been investigated to convert the characteristics of CNT-FETs to those of n-type semiconductor elements by forming a second insulating layer containing an organic compound having a bond between a carbon atom and a nitrogen atom, or a second insulating layer containing an electron-donating compound having one or more selected from nitrogen and phosphorus atoms, on a semiconductor layer containing CNTs (see, for example, Patent Literatures 1 and 2).

PATENT LITERATURE

Patent Literature 1: WO2017/130836
Patent Literature 2: WO2018/180146

SUMMARY OF THE INVENTION

Patent Literature 1 discloses a method of providing an n-type semiconductor element having improved n-type semiconductor characteristics resulted from CNTs with a layer provided thereon, the layer containing an organic compound having a bond between a carbon atom and a nitrogen atom. On the other hand, it has been found that the n-type semiconductor characteristics are degraded by long-term storage under atmospheric conditions.

To address this problem, Patent Literature 2 discloses a method of preventing the degradation of the n-type semiconductor characteristics due to long-term storage under atmospheric conditions by lowering the oxygen permeability of the layer on CNTs. However, it has been found that the restriction of the layer structure increases the number of the processes, and that the n-type semiconductor characteristics is partially degraded before a layer having low oxygen permeability is provided.

Accordingly, an object of the present invention is to provide an n-type semiconductor element having improved n-type semiconductor characteristics and excellent stability.

In order to solve the problems described above, the present invention has the following structure. Accordingly, the present invention provides an n-type semiconductor element, comprising:
a substrate;
a source electrode, a drain electrode, and a gate electrode;
a semiconductor layer in contact with both the source electrode and the drain electrode;
a gate insulating layer for insulating the semiconductor layer from the gate electrode; and
a second insulating layer positioned on the opposite side of the semiconductor layer from the gate insulating layer and in contact with the semiconductor layer;
wherein the semiconductor layer contains nanocarbon,
wherein the second insulating layer contains:
A. (a) a compound having one carbon-carbon double bond or one conjugated system bound to at least one group represented by general formula (1) and at least one group represented by general formula (2) (hereinafter, such a compound may be referred to as "compound (a)"); and
(b) a polymer; or
B. a polymer having, in its molecular structure, the remaining group after removing some hydrogen atoms from $R^1$, $R^2$, $R^3$, or $R^4$ in the compound (a), or the remaining group after removing some hydrogen atoms from the carbon-carbon double bond or the conjugated system in the compound (a),

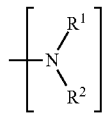

(1)

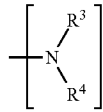

(2)

wherein, $R^1$ is selected from hydrogen, alkyl, and cycloalkyl;

$R^2$ to $R^4$ each is independently selected from hydrogen, alkyl, cycloalkyl, alkoxyalkyl, alkenyl, cycloalkenyl, alkynyl, aryl, and heteroaryl;

arbitrary two of $R^1$ to $R^4$ are optionally taken together to form a ring structure; and when two or more groups represented by general formula (1) or (2) are present, then two or more $R^1$, $R^2$, $R^3$, and $R^4$ present in the groups represented by general formula (1) or (2) are the same or different.

According to the present invention, an n-type semiconductor element having improved n-type semiconductor characteristics and excellent stability can be obtained. In addition, according to the manufacturing method of the present invention, the n-type semiconductor element can be obtained with a convenient process. Furthermore, a wireless communication device and a merchandise tag using the semiconductor element can be provided.

DETAILED DESCRIPTION OF EMBODIMENTS OF THE INVENTION

Preferred embodiments of the n-type semiconductor element, the method of manufacturing the n-type semiconductor element, the wireless communication device, and the merchandise tag according to the present invention will be described in detail below. However, the present invention is not limited to the following embodiments and various modifications can be made based on the purpose or application.

<N-Type Semiconductor Element>

In one embodiment of the present invention, the n-type semiconductor element comprises:

a substrate;

a source electrode, a drain electrode, and a gate electrode;

a semiconductor layer in contact with both the source electrode and the drain electrode;

a gate insulating layer for insulating the semiconductor layer from the gate electrode; and a second insulating layer positioned on the opposite side of the semiconductor layer from the gate insulating layer and in contact with the semiconductor layer;

wherein the semiconductor layer contains nanocarbon, and wherein the second insulating layer contains:

A. a compound having one carbon-carbon double bond or one conjugated system bound to at least one group represented by general formula (1) and at least one group represented by general formula (2) (compound (a)), and a polymer; or B. a polymer having, in its molecular structure, the remaining group after removing some hydrogen atoms from $R^1$, $R^2$, $R^3$, or $R^4$ in the compound (a), or the remaining group after removing some hydrogen atoms from the carbon-carbon double bond or the conjugated system in the compound (a).

Figure 1:
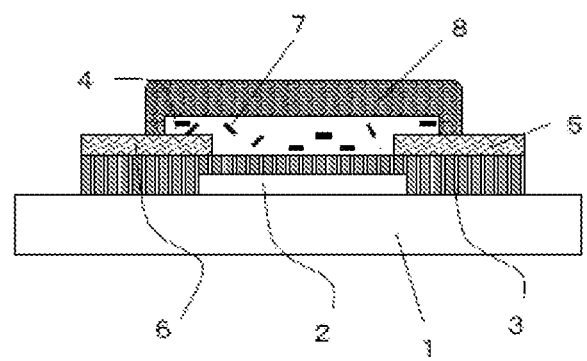
FIG. 1 is a schematic sectional view showing an n-type semiconductor element according to Embodiment 1 of the present invention.

FIG. 1 is a schematic sectional view showing a semiconductor element according to Embodiment 1 of the present invention. The semiconductor element according to Embodiment 1 comprises a gate electrode 2 formed on an insulating substrate 1, a gate insulating layer 3 covering the gate electrode 2, a source electrode 5 and a drain electrode 6 provided on the gate insulating layer 3, a semiconductor layer 4 provided between the electrodes, and a second insulating layer 8 covering the semiconductor layer. The semiconductor layer 4 contains nanocarbon 7.

This structure is a so-called bottom-gate, bottom-contact structure in which a gate electrode is positioned under a semiconductor layer, and a source electrode and a drain electrode are positioned on the bottom of the semiconductor layer.

Figure 2:
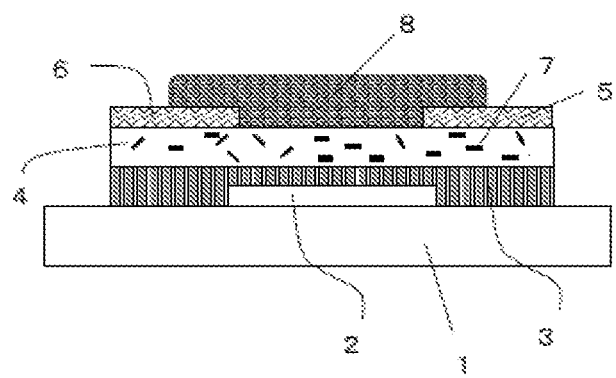
FIG. 2 is a schematic sectional view showing an n-type semiconductor element according to Embodiment 2 of the present invention.

FIG. 2 is a schematic sectional view showing a semiconductor element according to Embodiment 2 of the present invention. The semiconductor element according to Embodiment 2 comprises a gate electrode 2 formed on an insulating substrate 1, a gate insulating layer 3 covering the gate electrode 2, a semiconductor layer 4 provided on the gate insulating layer 3, a source electrode 5 and drain electrode 6 provided on the semiconductor layer 4, a second insulating layer 8 provide on the electrodes. The semiconductor layer 4 contains nanocarbon 7.

This structure is a so-called bottom-gate, top-contact structure in which a gate electrode is positioned under a semiconductor layer, and a source electrode and a drain electrode are positioned on the top of the semiconductor layer.

The structures of semiconductor elements according to embodiments of the present invention are not limited to these. The following explanation is common regardless of the structure of the semiconductor element, unless otherwise stated.

(Substrate)

The substrate may be composed of any material, provided that at least the side of the substrate on which the electrode system is arranged has insulating properties. Preferably, the substrate is composed of, for example, an inorganic material, such as silicon wafer, glass, sapphire, or sintered alumina; or an organic material, such as polyimide, polyvinyl alcohol, polyvinyl chloride, polyethylene terephthalate, polyvinylidene difluoride, polysiloxane, polyvinylphenol (PVP), polyester, polycarbonate, polysulfone, polyethersulfone, polyethylene, polyphenylenesulfide, or polyparaxylene.

The substrate may also be, for example, a laminate of a plurality of materials, such as a silicon wafer having a PVP film formed thereon, or polyethylene terephthalate having a polysiloxane film formed thereon.

(Electrode)

The gate electrode, source electrode, and drain electrode may be composed of any materials, which are electrically conductive and can be commonly used as electrodes. Examples of the electrically conductive material include, but are not limited thereto, electrically conductive metal oxides such as tin oxide, indium oxide, and indium tin oxide (ITO); metals and their alloys, such as platinum, gold, silver, copper, iron, tin, zinc, aluminum, indium, chromium, lithium, sodium, potassium, cesium, calcium, magnesium, palladium, molybdenum, amorphous silicon, and polysilicon; inorganic electrically conductive materials such as copper iodide, and copper sulfide; polythiophene, polypyrrole, polyaniline; complexes of, for example, polyethylenedioxythiophene and polystyrene sulfonate; electrically conductive polymers having an improved electrical conductivity due to doping of iodine or the like; carbon materials; and materials containing organic components and electrical conductors.

Among these, preferably, the electrodes contain an organic component and an electrical conductor, from the viewpoint of increased flexibility of the electrodes, better adhesion between the substrate and the gate insulating layer even during bending, and better electrical connection between the wiring and the semiconductor layer.

Examples of the organic component include, but are not limited to, a monomer, an oligomer, a polymer, a photopolymerization initiator, a plasticizing agent, leveling agent, a surfactant, a silane coupling agent, an anti-foaming agent, and a pigment. Preferably, the organic component is an oligomer or a polymer from the viewpoint of increased bending resistance of the electrode.

Examples of the oligomer or the polymer that can be used include, but are not limited to, an acrylic resin, an epoxy resin, a novolac resin, a phenol resin, a polyimide precursor, and a polyimide. Among these, especially preferably, the oligomer or the polymer is an acrylic resin from the viewpoint of cracking resistance during when the electrode is bent. This is presumably because an acrylic resin has a glass transition temperature of 100° C. or lower, and thus softens during heat curing of the electrically conductive film, which increase the binding properties among electrical conductor particles.

The term "acrylic resin" refers to a resin having at least an acrylic monomer-derived structure as a repeating unit. Specific examples of the acrylic monomer include all compounds having a carbon-carbon double bond, which may be used alone or in combination of two or more thereof.

The electrical conductor may be any electrically conductive material that can be commonly used as electrodes, preferably including an electrically conductive particle that is wholly or partially composed of an electrically conductive material and has electrically conductive properties in itself. Use of an electrically conductive particle as the electrical conductor leads to the formation of irregularities on the surface of the electrode containing the electrically conductive particle. When the gate insulating film enters the irregularities, an anchoring effect is generated, which improves the adhesion between the electrode and the gate insulating film. The improved adhesion between the electrode and the gate insulating film provides effects of improving the bending resistance of the electrode and of reducing the change in electrical characteristics when voltage is repeatedly applied to the semiconductor element. These effects improve the reliability of the semiconductor element.

A suitable electrically conductive material for the electrically conductive particle includes gold, silver, copper, nickel, tin, bismuth, lead, zinc, palladium, platinum, aluminum, tungsten, molybdenum, or carbon. More preferably, the electrically conductive particle contains at least one element selected from the group consisting of gold, silver, copper, nickel, tin, bismuth, lead, zinc, palladium, platinum, aluminum, and carbon. These electrically conductive particles may be used alone, or as an alloy, or as mixed particles.

Among these, especially preferably, the electrically conductive particle is a gold, silver, copper, or platinum particle from the viewpoint of electrically conductive properties. Among these, preferably, the electrically conductive particle is silver from the viewpoint of the cost and stability.

The widths and thicknesses of the gate electrode, source electrode, and drain electrode, and the interval between the source and drain electrodes can be designed to be any values. Preferably, for example, the widths of the electrodes are from 10 µm to 10 mm, and the thicknesses of the electrodes are from 0.01 µm to 100 µm, while the interval between the source electrode and the drain electrode is from 1 µm to 1 mm, without limitation.

These materials for preparing the electrodes may be used alone. Alternatively, a plurality of the materials may be laminated to form an electrode, or may be mixed and used to form an electrode.

(Gate Insulating Layer)

The gate insulating layer may be composed of any material which provide insulating properties between the semiconductor layer and the gate electrode, including an inorganic material such as silicon oxide, or alumina; an organic polymer material such as polyimide, polyvinyl alcohol, polyvinyl chloride, polyethylene terephthalate, polyvinylidene difluoride, polysiloxane, or polyvinylphenol (PVP); or a combination of an inorganic material powder and an organic material.

Among these, especially preferably, the gate insulating layer contains an organic compound having a silicon-carbon bonding, more preferably polysiloxane.

Preferably, the gate insulating layer further contains a metal compound having a bonding between a metal atom and an oxygen atom. Examples of such a metal compound include, but are not limited to metal oxide, and metal hydroxide. The metal compound may comprise any metal atom that form a metal chelate. Examples of the metal atom include magnesium, aluminum, titanium, chromium, manganese, cobalt, nickel, copper, zinc, gallium, zirconium, ruthenium, palladium, indium, hafnium, and platinum. Among these, preferably, the metal atom is aluminum from the viewpoint of the availability, the cost, and the stability of the metal chelate.

Preferably, the thickness of the gate insulating layer is from 0.05 µm to 5 µm, and more preferably from 0.1 µm to 1 µm. A thickness in this range allows for easy and uniform film formation. The thickness can be measured by a method such as atomic force microscopy or ellipsometry.

The gate insulating layer may be a monolayer or a multilayer. A single layer may be formed by a plurality of insulating materials, or a plurality of insulating materials may be layered to form a plurality of insulating layers.

(Semiconductor Layer)

The semiconductor layer contains nanocarbon. The term "nanocarbon" refers to a material composed of carbon having a nanometer-sized structure, including, for example, carbon nanotubes (CNTs), graphene, carbon nanohorns, carbon nanoribbons, and encapsulated CNTs. Preferred embodiment of nanocarbon is CNTs or graphene, and more preferably CNTs, from the viewpoint of the semiconductor characteristics. Further, preferably, CNTs are used as CNT complexes having a conjugated polymer attached to at least a portion of the surface thereof. The semiconductor layer may further contain an organic semiconductor or an insulating material without impairing the electrical characteristics.

Preferably, the thickness of the semiconductor layer is from 1 nm to 100 nm. A thickness in this range allows for easy and uniform film formation. More preferably, the thickness of the semiconductor layer is from 1 nm to 50 nm, and still more preferably from 1 nm to 20 nm. The thickness can be measured by a method such as atomic force microscopy or ellipsometry.

(CNT)

The CNTs may be single-walled CNTs in which one sheet of carbon film (graphene sheet) is rolled in a cylindrical shape, or double-walled CNTs in which two graphene sheets are concentrically rolled, or multi-walled CNTs in which a plurality of graphene sheets is concentrically rolled. Preferably, single-walled CNTs are used to achieve improved semiconductor characteristics. CNTs can be obtained by arc discharge, CVD, laser ablation, or other method.

More preferably, the CNTs contain 80% by weight or more of semiconductor CNTs with respect to the total weight of CNTs. Still more preferably, the CNTs contains 90% by weight or more of semiconductor CNTs, and particularly preferably, 95% by weight or more of semiconductor CNTs. CNTs containing 80% by weight or more of semiconducting CNTs can be provided using a known method. The method includes, for example, performing ultracentrifugation in the presence of a density gradient agent; selectively attaching a specific compound to the surface of semiconducting or metallic CNTs and separating them using differences in solubility; or separating them by electrophoresis or other techniques using differences in electrical properties. The method of determining the content of semiconducting CNTs in CNTs includes, for example, calculating it based on the absorption area ratio from the visible-near-infrared absorption spectrum, or calculating it based on the intensity ratio from the Raman spectrum.

Preferably, when CNTs are used in the semiconductor layer of the semiconductor element in the present invention, the length of the CNTs is shorter than the distance between the source and drain electrodes (hereinafter, referred to as "distance between the electrodes"). Preferably, the average length of the CNTs is 2 µm or less, and more preferably 1 µm or less, depending on the distance between the electrodes. Methods of shorten the length of the CNTs include acid treatments, and freeze-crush processes.

The average length of CNTs is determined as the average value of the lengths of randomly selected 20 CNTs. The method of measuring the average length of the CNTs include randomly selecting 20 CNTs from an image obtained in, for example, atomic force microscopy, scanning electron microscopy, or transmission electron microscopy and determining the average value of the lengths thereof.

In general, commercially available CNTs show a distribution in the length and may contain CNTs that are longer than the distance between the electrodes. Thus, preferably, the method includes a step of shorten the CNTs than the distance between the electrodes. For example, the CNTs are effectively cut into shorter fibers by, for example, acid treatment, such as with nitric acid or sulfuric acid, sonication, or freeze-crush process. Further, preferably, separation through a filter is combined from the viewpoint of improvement of the purity of the CNTs.

Preferably, but not limited to, the diameter of the CNTs is 1 nm or more and 100 nm or less, and more preferably 50 nm or less.

In the present invention, preferably, steps of uniformly dispersing CNTs in a solvent, and filtering the dispersion are included. CNTs smaller than the filter pore size is obtained from the filtrate, to efficiently give CNTs shorter than the distance between the electrodes. A suitable filter for use in such an embodiment is a membrane filter. The pore size of the filter for use in the filtration needs to be smaller than the distance between the electrodes, and preferably from 0.5 µm to 10 µm.

(CNT Complex)

Preferably, the CNTs in the present invention are used with a conjugated polymer attached to at least a portion of the surface thereof (hereinafter, the CNTs with a conjugated polymer attached thereto are referred to as "CNT complexes"). As used herein, the term "conjugated polymer" refers to a compound comprising a repeating unit with a conjugated structure, and having a degree of polymerization of 2 or more.

A conjugated polymer attached to at least a portion of the surface of the CNTs allows for uniform dispersion of the CNTs in a solution without impairing high electrical properties possessed by the CNTs. Use of a solution of uniformly dispersed CNTs in a coating method allows for formation of a film containing uniformly dispersed CNTs. This provides improved semiconductor characteristics.

A conjugated polymer attached to at least a portion of the surface of CNTs means that the conjugated polymer covers a portion of or entire surface of the CNTs. Coverage of CNTs with a conjugated polymer is possible presumably due to the interaction caused by the overlap of pi electron clouds originated from the conjugated structures of CNTs and the conjugated polymer.

Whether CNTs are covered with a conjugated polymer is determined based on the reflected color. Unlike the reflected color from uncovered CNTs, the reflected color from covered CNTs is similar to the reflected color from a conjugated polymer. An elementary analysis such as X-ray photoelectron spectroscopy (XPS) can be quantitatively used to determine the presence of adhered substances on CNTs and to determine the weight ratio between CNTs and adhered substances.

Preferably, the weight average molecular weight of the conjugated polymer is 1000 or more from the viewpoint of ease of adhesion to CNTs.

The method of attaching a conjugated polymer to CNTs include, for example, (I) adding CNTs to a molten conjugated polymer and mixing them; (II) dissolving a conjugated polymer in a solvent, adding CNTs to the solution, and mixing them; (III) preliminarily dispersing CNTs in a solvent by sonication or other means, adding a conjugated polymer to the dispersion, and mixing them; or (IV) adding a conjugated polymer and CNTs to a solvent, sonicating the mixture, and mixing them. Any of the methods may be used in the present invention, and two or more of the methods may be used in combination.

Examples of the conjugated polymer include, but not limited to, a polythiophene-based polymer, a polypyrrole-based polymer, a polyaniline-based polymer, a polyacetylene-based polymer, a poly-p-phenylene-based polymer, and a poly-p-phenylenevinylene-based polymer. Preferably, the polymer to be used is made of a single monomer unit. Alternatively, also preferably, the polymer to be used is a block copolymer, a random copolymer, or a graft polymer of different monomer units.

Among the above-described polymers, especially preferably, in the present invention, a polythiophene-based polymer is used as the polymer from the viewpoints of ease of adhesion to CNTs and ease of formation of CNT complexes. Among the polythiophene-based polymers, those containing, in the repeating unit, a fused heteroaryl unit having a nitrogen-containing double bond in the ring and a thiophene unit are more preferred.

Examples of the fused heteroaryl unit having a nitrogen-containing double bond in the ring include thienopyrrole, pyrrolothiazole, pyrrolopyridazine, benzimidazole, benzotriazole, benzoxazole, benzothiazole, benzothiadiazole, quinoline, quinoxaline, benzotriazine, thienooxazole, thienopyridine, thienothiazine, and thienopyrazine units. Among these, especially preferably, the fused heteroaryl is a benzothiadiazole unit or a quinoxaline unit. Inclusion of the units results in improved adhesion between CNTs and the conjugated polymer, and better dispersion of the CNTs in the semiconductor layer.

(Second Insulating Layer)

The second insulating layer is formed on the opposite side of the semiconductor layer from the side on which the gate insulating layer is formed. The phrase "on the opposite side of the semiconductor layer from the side on which the gate insulating layer is formed," for example, in the case where the gate insulating layer is present on the lower side of the semiconductor layer, refers to the upper side of the semiconductor layer. The formation of the second insulating layer in the present invention results in conversion of a nanocarbon-FET that normally exhibits p-type semiconductor characteristics into a semiconductor element that exhibits n-type semiconductor characteristics.

The second insulating layer contains (a) a compound having one carbon-carbon double bond or one conjugated system bound to at least one group represented by general formula (1) and at least one group represented by general formula (2) (compound (a)), and (b) a polymer.

The compound (a) has, in its molecular structure, at least one of a carbon-carbon double bond and a conjugated system, and at least one group represented by general formula (1) and at least one group represented by general formula (2) directly bound to the carbon-carbon double bond or the conjugated system (the carbon-carbon double bond or the conjugated system bound to groups represented by general formulae (1) and (2) is referred to as "first delocalized electronic system" for convenience). The compound (a) may have two or more first delocalized electronic system, or may have a delocalized electronic system other than the first delocalized electronic system, or a carbon-carbon double bond or a conjugated system bound to only one or none of groups represented by general formulae (1) and (2).

For identification of the groups represented by general formulae (1) and (2), when two or more groups corresponding to general formula (1) are directly bound to one carbon-carbon double bond or conjugated system, one of the groups is considered as corresponding to a group represented by general formula (2), so that the one carbon-carbon double bond or conjugated system bound to the groups is considered as corresponding to "first delocalized electronic system."

When the compound (a) has one carbon-carbon double bond or one conjugated system bound to at least one group represented by general formula (1) and at least one group represented by general formula (2), the one carbon-carbon double bond or one conjugated system has a Pi orbital with higher electron density. In addition, since such a structure as one carbon-carbon double bond or one conjugated system tend to form a Pi-Pi interaction or a charge transfer interaction with nanocarbon, the compound (a) forms a strong electronic interaction with nanocarbon, which presumably can convert a nanocarbon-FET normally exhibiting p-type semiconductor characteristics into a semiconductor element exhibiting stable n-type semiconductor characteristics.

Further, the second insulating layer contains a polymer, which can presumably maintain a stable interaction between the compound (a) and nanocarbon, providing more stable n-type semiconductor characteristics.

In general formulae (1) and (2), le is selected from hydrogen, alkyl, and cycloalkyl. $R^2$ to $R^4$ each is independently selected from hydrogen, alkyl, cycloalkyl, alkoxyalkyl, alkenyl, cycloalkenyl, alkynyl, aryl, and heteroaryl. Arbitrary two of $R^1$ to $R^4$ may be taken together to form a ring structure. When two or more groups represented by general formula (1) or (2) are present, then two or more $R^1$, $R^2$, $R^3$, and $R^4$ to be found in the groups represented by general formula (1) or (2) are the same or different. When $R^1$ to $R^4$ in general formulae (1) and (2) have the structures described later, one carbon-carbon double bond or one conjugated system in the compound (a) and the nitrogen atoms in general formulae (1) and (2) tend to be in the proximity of nanocarbon, which can result in enhanced electronic interaction between the compound (a) and nanocarbon, and stabilized n-type semiconductor characteristics.

The term "alkyl group" represents a saturated aliphatic hydrocarbon group, such as methyl, ethyl, n-propyl, isopropyl, n-butyl, sec-butyl, or tert-butyl. An alkyl group may or may not have a substituent. When an alkyl group has a substituent, any substituent may be used, including alkoxy, aryl, or heteroaryl. The substituent may further have a substituent. Unless otherwise stated, the description of substituents is common to the following descriptions. Preferably, the number of carbon atoms in an alkyl group is, without limitation, from 1 to 20, and more preferably from 1 to 8, from the viewpoint of the availability and the cost.

The term "cycloalkyl group" represents a saturated alicyclic hydrocarbon group, such as cyclopropyl, cyclohexyl, norbornyl, or adamantyl. A cycloalkyl group may or may not have a substituent. Preferably, the number of carbon atoms in a cycloalkyl group is, without limitation, from 3 to 20.

The term "alkenyl group" represents an unsaturated aliphatic hydrocarbon group having a double bond, such as vinyl, aryl, or butadienyl. An alkenyl group may or may not have a substituent. Preferably, the number of carbon atoms in an alkenyl group is, without limitation, from 2 to 20.

The term "cycloalkenyl group" represents an unsaturated alicyclic hydrocarbon group having a double bond, such as cyclopentenyl, cyclopentadienyl, or cyclohexenyl. A cycloalkenyl group may or may not have a substituent. Preferably, the number of carbon atoms in a cycloalkenyl group is, without limitation, from 3 to 20.

The term "alkynyl group" represents an unsaturated aliphatic hydrocarbon group having a triple bond, such as ethinyl. An alkynyl group may or may not have a substituent. Preferably, the number of carbon atoms in an alkynyl group is, without limitation, from 2 to 20.

The term "aryl group" represents an aromatic hydrocarbon group, such as phenyl, naphthyl, biphenyl, anthracenyl, phenanthryl, terphenyl, or pyrenyl. An aryl group may or may not have a substituent. Preferably, the number of carbon atoms in an aryl group is, without limitation, from 6 to 40.

The term "heteroaryl group" represents an aromatic group having one or several atoms other than carbon in the ring, such as furanyl, thiophenyl, benzofuranyl, dibenzofuranyl, pyridyl, or quinolinyl. A heteroaryl group may or may not have a substituent. Preferably, the number of carbon atoms in a heteroaryl group is, without limitation, from 2 to 30.

The phrase "arbitrary two of $R^1$ to $R^4$ are taken together to form a ring structure" means that for example, $R^1$ and $R^2$, or $R^1$ and $R^3$ are bound together to form a conjugated or nonconjugated ring structure. In addition to carbon atom, the ring structure may contain a nitrogen, oxygen, sulfur, phosphorus, or silicon atom as a constituent element. The ring structure may be further fused to another ring.

The term "conjugated system" refers to a system in which two or more multiple bonds are conjugated, and Pi electrons in the multiple bonds interact with each other through single bonds in a delocalized state. For example, a conjugated system is a structure in which double and/or triple bonds are linked by a single bond, an unshared electron pair, or an atom with an empty p-orbital. Specific examples of the conjugated system are shown in general formulae (3) to (5).

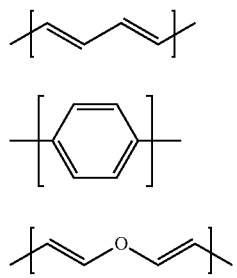

(3)

(4)

(5)

Examples of the structure in which one conjugated system is bound to at least one group represented by general formula (1) and at least one group represented by general formula (2) include the compounds represented by general formulae (6) to (9). In the chemical formula, the conjugated system bound to groups represented by general formulae (1) and (2) is surrounded by a dotted line. The compounds represented by general formulae (10) and (11) are not equivalent to the compounds having a first delocalized electronic system.

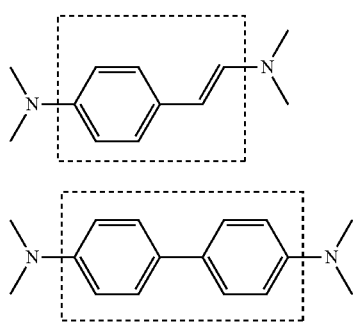

(6)

(7)

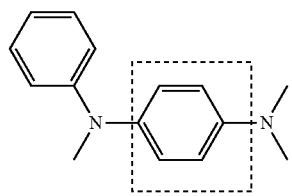

(8)

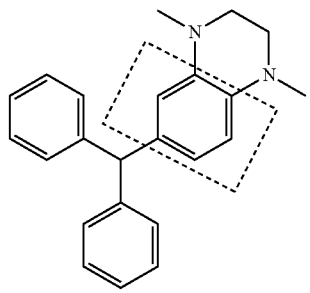

(9)

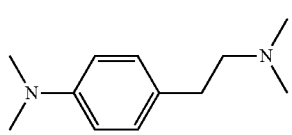

(10)

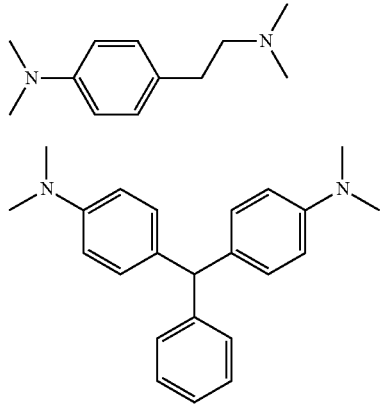

(11)

Examples of the compound (a) include tetrakis(dimethylamino)ethylene, 4-((2-dimethylamino)vinyl)-N,N-dimethylaniline, 1,2-phenylenediamine, 1,4-phenylenediamine, 2,3,5,6-tetramethyl-1,4-phenylenediamine, N,N-dimethyl-1,4-phenylenediamine, N,N-dimethyl-N',N'-diphenyl-1,4-phenylenediamine, N,N,N'-trimethyl-N'-phenyl-1,4-phenylenediamine, N,N,N'-trimethyl-1,4-phenylenediamine, N,N,N',N'-tetramethyl-1,4-phenylenediamine, N,N,N',N'-tetraethyl-1,4-phenylenediamine, 1,4-di(pyrrolidin-1-yl)benzene, 1,4-di(piperidin-1-yl)benzene, 1,4-dimorpholinobenzene, N,N-bis(methoxymethyl)-N',N'-dimethyl-1,4-phenylenediamine, 5,10-dihydro-5,10-dimethylphenazine, benzidine, 3,3',5,5'-tetramethylbenzidine, N,N,N',N'-tetramethylbenzidine, 4-(pyrrolidine-1-yl)aniline, 4-(4-methylpiperidine-1-yl)aniline, 2,4-dipiperidine-1-yl-phenylamine, tris[4-(diethylamino)phenyl]amine, N,N,N',N'-tetrakis[4-(diisobutylamino)phenyl]-1,4-phenylenediamine, 1,5-diaminonaphthalene, 1,8-diaminonaphthalene, 2,7-diaminofluorene, and N,N,N',N'-tetramethyl-2,7-diaminofluorene. These compounds (a) may be used alone or in combination of two or more thereof.

Preferably, the compound (a) has a conjugated system comprising an aromatic ring. The inclusion of an aromatic ring in the conjugated system can enhance the electronic interaction between the compound (a) and CNT.

In such an embodiment, examples of the compound (a) include 4-((2-dimethylamino)vinyl)-N,N-dimethylaniline, 1,2-phenylenediamine, 1,4-phenylenediamine, 2,3,5,6-tetramethyl-1,4-phenylenediamine, N,N-dimethyl-1,4-phenylenediamine, N,N-dimethyl-N',N'-diphenyl-1,4-phenylenediamine, N,N,N'-trimethyl-N'-phenyl-1,4-phenylenediamine, N,N,N'-trimethyl-1,4-phenylenediamine, N,N,N',N'-tetramethyl-1,4-phenylenediamine, N,N,N',N'-tetraethyl-1,4-phenylenediamine, 1,4-di(pyrrolidin-1-yl)benzene, 1,4-di(piperidin-1-yl)benzene, 1,4-dimorpholinobenzene, N,N-bis(methoxymethyl)-N',N'-dimethyl-1,4-phenylenediamine, 5,10-dihydro-5,10-dimethylphenazine, benzidine, 3,3',5,5'-tetramethylbenzidine, N,N,N',N'-tetramethylbenzidine, 4-(pyrrolidine-1-yl)aniline, 4-(4-methylpiperidine-1-yl)aniline, 2,4-dipiperidine-1-yl-phenylamine, tris[4-(diethylamino)phenyl]amine, N,N,N',N'-tetrakis[4-(diisobutylamino)phenyl]-1,4-phenylenediamine, 1,5-diaminonaphthalene, 1,8-diaminonaphthalene, 2,7-diaminofluorene, and N,N,N',N'-tetramethyl-2,7-diaminofluorene.

Preferably, the compound (a) comprises arylenediamine or heteroarylenediamine. That is, more preferably, a conjugated system bound to groups represented by general formulae (1) and (2) comprises a structure derived from arylenediamine or heteroarylenediamine. As used herein, the term "comprising a structure derived from arylenediamine or heteroarylenediamine" means that an arylene or heteroarylene group bound to a nitrogen atom derived from an amino group is found in a conjugated system bound to groups represented by general formulae (1) and (2). The derivative described above can make the conjugated system have a Pi orbital with higher electron density, thereby enhancing the electronic interaction between the compound and CNT. The term "arylenediamine" refers to an arylene group directly bound to two amino groups, while the term "heteroarylenediamine" refers to a heteroarylene group directly bound to two amino groups.

In such an embodiment, examples of the compound (a) include 1,2-phenylenediamine, 1,4-phenylenediamine, 2,3,5,6-tetramethyl-1,4-phenylenediamine, N,N-dimethyl-1,4-phenylenediamine, N,N-dimethyl-N',N'-diphenyl-1,4-phenylenediamine, N,N,N'-trimethyl-N'-phenyl-1,4-phenylenediamine, N,N,N'-trimethyl-1,4-phenylenediamine, N,N,N',N'-tetramethyl-1,4-phenylenediamine, N,N,N',N'-tetraethyl-1,4-phenylenediamine, 1,4-di(pyrrolidin-1-yl)benzene, 1,4-di(piperidin-1-yl)benzene, 1,4-dimorpholinobenzene, N,N-bis(methoxymethyl)-N',N'-dimethyl-1,4-phenylenediamine, benzidine, 3,3',5,5'-tetramethylbenzidine, N,N,N',N'-tetramethylbenzidine, 4-(pyrrolidine-1-yl)aniline, 4-(4-methylpiperidine-1-yl)aniline, 2,4-dipiperidine-1-yl-phenylamine, tris[4-(diethylamino)phenyl]amine, N,N,N',N'-tetrakis[4-(diisobutylamino)phenyl]-1,4-phenylenediamine, 1,5-diaminonaphthalene, 1,8-diaminonaphthalene, 2,7-diaminofluorene, and N,N,N',N'-tetramethyl-2,7-diaminofluorene. Preferably, the compound (a) includes 1,2-phenylenediamine or 1,4-phenylenediamine. Still more preferably, the compound (a) includes 1,4-phenylenediamine.

More preferably, all of the groups represented by general formulae (1) and (2) contained in the compound (a) are tertiary amine. In such an embodiment, the nitrogen atoms in general formulae (1) and (2) are not bound to any hydrogen atoms, which can prevent amine destabilization that may occur in the case of primary amine or secondary amine due to release of hydrogen atom, and increase the stability.

In such an embodiment, examples of the compound (a) include tetrakis(dimethylamino)ethylene, N,N-dimethyl-N',N'-diphenyl-1,4-phenylenediamine, N,N,N'-trimethyl-N'-phenyl-1,4-phenylenediamine, N,N,N',N'-tetramethyl-1,4-phenylenediamine, N,N,N',N'-tetraethyl-1,4-phenylenediamine, 1,4-di(pyrrolidine-1-yl)benzene, 1,4-di(piperidine-1-yl)benzene, 1,4-dimorpholinobenzene, N,N-bis(methoxymethyl)-N',N'-dimethyl-1,4-phenylenediamine, 5,10-dihydro-5,10-dimethylphenazine, N,N,N',N'-tetramethylbenzidine, N,N-dimethyl-4-(pyrrolidine-1-yl)aniline, tris[4-(diethylamino)phenyl]amine, N,N,N',N'-tetrakis[4-(diisobutylamino)phenyl]-1,4-phenylenediamine, and N,N,N',N'-tetramethyl-2,7-diaminofluorene.

More preferably, at least one group represented by general formula (1) directly bound to a carbon-carbon double bond or one conjugated system in the compound (a) has $R^1$ and $R^2$ selected from the group consisting of alkyl and cycloalkyl. When $R^1$ and $R^2$ are alkyl or cycloalkyl, the nitrogen atom has higher electron density. Thus, the Pi orbital of the one carbon-carbon double bond or the one conjugated system has higher electron density, which can enhance the electronic interaction between the compound and the nanocarbon.

In such an embodiment, examples of the compound (a) include tetrakis(dimethylamino)ethylene, 4-((2-dimethylamino)vinyl)-N,N-dimethylaniline, N,N-dimethyl-1,4-phenylenediamine, N,N-dimethyl-N',N'-diphenyl-1,4-phenylenediamine, N,N,N'-trimethyl-N'-phenyl-1,4-phenylenediamine, N,N,N'-trimethyl-1,4-phenylenediamine, N,N,N',N'-tetramethyl-1,4-phenylenediamine, N,N,N',N'-tetraethyl-1,4-phenylenediamine, 1,4-di(pyrrolidin-1-yl)benzene, 1,4-di(piperidin-1-yl)benzene, 1,4-dimorpholinobenzene, N,N-bis(methoxymethyl)-N',N'-dimethyl-1,4-phenylenediamine, N,N,N',N'-tetramethylbenzidine, 4-(pyrrolidine-1-yl)aniline, 4-(4-methylpiperidine-1-yl)aniline, 2,4-dipiperidine-1-yl-phenylamine, tris[4-(diethylamino)phenyl]amine, N,N,N',N'-tetrakis[4-(diisobutylamino)phenyl]-1,4-phenylenediamine, and N,N,N',N'-tetramethyl-2,7-diaminofluorene.

More preferably, all the groups represented by general formula (1) contained in the compound (a) have $R^1$ and $R^2$ selected from alkyl or cycloalkyl. Still more preferably, all the groups represented by general formulae (1) and (2) contained in the compound (a) have $R^1$ to $R^4$ selected from alkyl or cycloalkyl.

Examples of the polymer used in the second insulating layer in combination with the compound (a) (hereinafter, also referred to as "polymer (b)") include polyimide, polyvinyl chloride, polyethylene terephthalate, polyvinylidene difluoride, polysiloxane, polyvinylphenol, polyvinylpyrrolidone, polyester, polycarbonate, polysulfone, polyethersulfone, polyethylene, polypropylene, a cyclo-olefin polymer, polyphenylenesulfide, polyvinyl acetate, an acrylic resin.

Particularly preferably, the polymer (b) used contains a carbon atom and a heteroatom. Since compound (a) and nanocarbon electronically interact with each other, both are considered to be partially charged. A polar polymer, or a polymer containing a carbon atom and a heteroatom, present around the compound and nanocarbon that are interacted with each other as described above presumably stabilize the compound/nanocarbon interaction described above. Particularly preferably, the polymer (b) is a polymer having an ester bonding. Preferred polymers include, for example, polyester, polycarbonate, polyvinyl acetate, and acrylic resins having ester bonding such as polymethyl methacrylate or polymethyl acrylate. Especially preferably, the polymer is a resin having a low content of functional groups with a heteroatom bound to a hydrogen atom. Examples of the functional groups with a heteroatom bound to a hydrogen atom include hydroxy, mercapto, carboxy, and sulfo groups. Preferred examples of the resin include polymethyl methacrylate and polymethyl acrylate.

Preferably, the water absorption of the polymer (b) is 0.5% by weight or less. Protonation of the nitrogen atoms present in general formulae (1) and (2) in the compound (a) as described above by water in the polymer may reduce the electron density in the Pi orbital of the compound (a), diminishing the electronic interaction between the compound and the nanocarbon. When the polymer (b) contains a small amount of water, or when the water absorption of the polymer is low, such an event can be prevented, thus presumably leading to stable n-type semiconductor characteristics. More preferably, the water absorption of the polymer (b) is 0.3% by weight or less, and still more preferably 0.1% by weight or less.

The water absorption of the polymer is determined by immersing a test specimen in water at 23° C. for one week and measuring the mass change, according to JIS K 7209 2000 (Plastics—Determination of water absorption).

Analysis methods of the compound (a) or the polymer (b) in the second insulating layer include a method comprising, for example, extracting components constituting the second insulating layer from the n-type semiconductor element to obtain a sample, and analyzing the sample by nuclear magnetic resonance (NMR) or other techniques; and a method comprising analyzing the second insulating layer by XPS or other techniques.

Preferably, the thickness of the second insulating layer is 500 nm or more, and more preferably 1.0 µm or more, and still more preferably 3.0 µm or more, and particularly preferably 10 µm or more. The thickness in this range allows a semiconductor element to be converted to show improved n-type semiconductor characteristics, as well as improved stability of n-type TFT characteristics. In a preferred but not limiting embodiment, the upper of the thickness is 500 µm or less.

The thickness of the second insulating layer is determined by analyzing the cross-section of the second insulating layer using a scanning electron microscope, measuring the thicknesses at 10 randomly selected locations in the second insulating layer portion located on the semiconductor layer in the obtained image, and calculating the arithmetic mean.

In addition to the compound (a) and the polymer (b), the second insulating layer may contain other compounds. Examples of the other compounds, in the case where the second insulating layer is formed by application, include thickening agents and thixotropic agents for controlling the viscosity or rheology of the solution.

The second insulating layer may be a monolayer or a multilayer. When the second insulating layer is a multilayer, at least one layer may contain the compound (a) and the polymer (b), or separate layers may contain the compound (a) and the polymer (b), respectively, provided that at least the layer containing the compound (a) is in contact with the semiconductor layer. For example, a first layer containing the compound (a) may be formed on the semiconductor layer, and a second layer containing the polymer (b) may be formed on the first layer.

In the present invention, instead of containing the compound (a) and the polymer (polymer (b)), a polymer into which a functional group that performs the same action as the compound (a) is introduced can be used. Such a polymer may be a polymer having, in its molecular structure, the remaining group after removing some (usually one hydrogen atom (or two hydrogen atoms in the case of a divalent group)) hydrogen atoms from $R^1$, $R^2$, $R^3$, or $R^4$ in the compound (a), or the remaining group after removing some (usually one hydrogen atom (or two hydrogen atoms in the case of a divalent group)) hydrogen atoms from the carbon-carbon double bond or the conjugated system in the compound (a). Here, the above-described preferred embodiment of the polymer (a) and the preferred embodiment of the polymer (b) can be applied to this polymer as necessary.

(Protective Layer)

The n-type semiconductor element according to embodiments of the present invention may further have a protective layer on the second insulating layer. The roles of the protective layer include protection of the semiconductor element from physical damage such as abrasion, and from water and oxygen in the atmosphere.

Examples of the material of the protective layer include inorganic materials such as silicon wafer, glass, sapphire, and sintered alumina; and organic materials such as polyimide, polyvinyl alcohol, polyvinyl chloride, polyethylene terephthalate, polyvinylidene difluoride, polysiloxane, polyvinylphenol, polyester, polycarbonate, polysulfone, polyethersulfone, polyethylene, polyphenylenesulfide, polyparaxylene, polyacrylonitrile, and cyclo-olefin polymers. The protective layer may also be, for example, a laminate of a plurality of materials, such as a silicon wafer having a polyvinylphenol film formed thereon, or polyethylene terephthalate having an aluminum oxide film formed thereon.

The semiconductor element according to embodiments in the present invention can control the current that flows between the source electrode and the drain electrode (source-drain current) by changing the gate voltage. The mobility $\mu(cm^2/V \cdot s)$ of the semiconductor element can be calculated using the following equation (a):

$$\mu = (\delta Id/\delta Vg) L \times D/(W \times \varepsilon r \times \varepsilon \times Vsd) \qquad (a)$$

Here, Id indicates source-drain current (A), Vsd indicates source-drain voltage (V), Vg indicates gate voltage (V), D indicates thickness of the gate insulating layer (m), L indicates channel length (m), W indicates channel width (m), εr indicates relative permittivity of the gate insulating layer (F/m), ε indicates vacuum permittivity ($8.85 \times 10^{-12}$ F/m), and δ indicates the amount of change in the relevant physical value.

The threshold voltage can be determined from the point of intersection of extension line of the linear part in the Id-Vg graph and the Vg axis.

An n-type semiconductor element operates by application of a positive voltage greater than the threshold voltage to the gate electrode, which causes conduction between the source and drain electrodes. An n-type semiconductor element with a small absolute value of threshold voltage and high mobility is considered as having high functionality and good characteristics.

(Method of Manufacturing n-Type Semiconductor Element)

The n-type semiconductor element according to embodiments of the present invention can be manufactured using various methods, including but not limited to, a manufacturing method preferably comprising the steps of applying a composition containing the components of the second insulating layer described above and a solvent, and drying the coating film. Preferably, the manufacturing method also comprises a step of forming a semiconductor layer by a coating method. For formation of a semiconductor layer by a coating method, the manufacturing method comprises at least the steps of applying a solution containing the components of the semiconductor layer and a solvent, and drying the coating film.

Hereinafter, the method of manufacturing the semiconductor element according to embodiments of the present invention will be described in detail taking as an example the case of manufacturing a semiconductor element having the structure shown in FIG. 1.

Figure 3A:
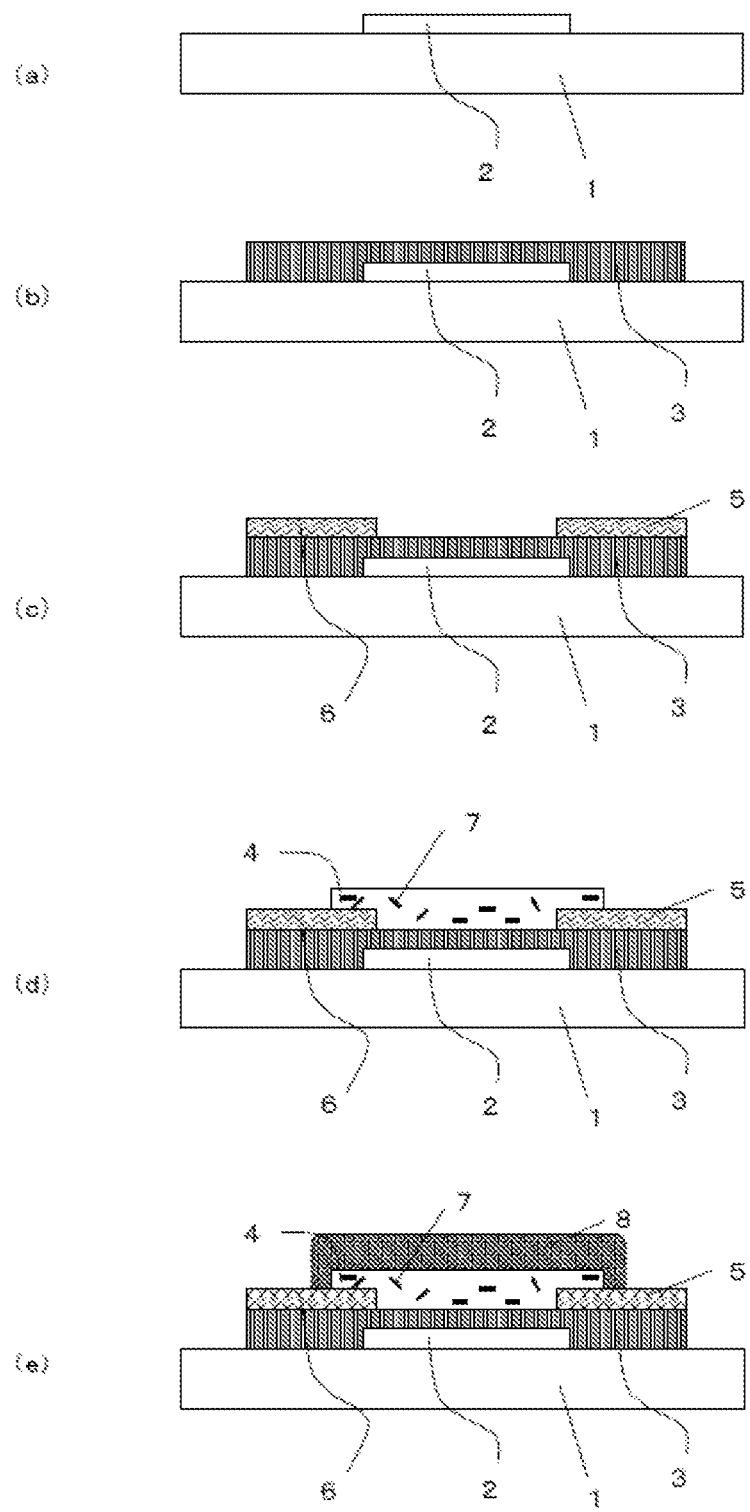
FIG. 3A is a sectional view showing a process for manufacturing an n-type semiconductor element according to Embodiment 1 of the present invention.

First, as shown in FIG. 3A (a), a gate electrode 2 is formed on an insulating substrate 1. The gate electrode 2 is formed by any method using known technologies, such as resistance heating vapor deposition, electron beam, sputtering, plating, chemical vapor deposition (CVD), ion plating coating, inkjet, and printing. Another exemplary method of forming an electrode comprises applying a paste containing an organic component and an electrical conductor on an insulating substrate using known technologies, such as spin coating, blade coating, slit die coating, screen printing, bar coating, molding, print transferring, and dip coating, and drying the paste using, for example, an oven, a hot plate, or an infrared ray.

In the method of forming the electrode pattern, the pattern of the electrode film to be prepared by the above method may be formed into a desired shape using, for example, a known photolithography technique, or alternatively, the pattern may be formed via a mask having a desired shape during vapor deposition or sputtering of electrode materials.

Next, a gate insulating layer 3 is formed on the gate electrode 2 as shown in FIG. 3A (b). The gate insulating layer 3 may be prepared by any method, for example, comprising applying a composition containing materials for forming the insulating layer on the substrate, drying the composition to obtain a coating film, and as needed, heating the coating film. Examples of the coating method include spin coating, blade coating, slit die coating, screen printing, bar coating, molding, print transferring, and dip coating methods. Preferably, the temperature of the heat treatment for the coating film is in the range from 100° C. to 300° C.

Next, as shown in FIG. 3A (c), a source electrode 5 and a drain electrode 6 are simultaneously formed on the gate insulating layer 3 using the same materials by the method described above. The electrodes are formed using a similar method to that of forming the gate electrode.

Next, as shown in FIG. 3A (d), a semiconductor layer 4 is formed between the source electrode 5 and the drain electrode 6. The semiconductor layer 4 can be formed using a dry method, such as resistance heating vapor deposition, electron beam, sputtering, or CVD, but in a preferred embodiment, a coating method is used from the viewpoint of the manufacturing cost and the suitability for large areas. Specific and preferred coating methods include spin coating, blade coating, slit die coating, screen printing, bar coating, molding, print transferring, dip coating, and inkjet printing methods. Among these, preferably, the coating method is selected from them dependent on the desired coating characteristics, such as coating thickness control and orientation control. The formed coating film may also be subjected to annealing treatment under atmospheric conditions, reduced pressure, or an inert gas atmosphere such as nitrogen or argon.

Next, as shown in FIG. 3A (e), a second insulating layer 8 is formed to cover the semiconductor layer 4. The second insulating layer 8 can be formed by any method, including resistance heating vapor deposition, electron beam, lamination, sputtering, or CVD, but in a preferred embodiment, a coating method is used from the viewpoint of the manufacturing cost and the suitability for large areas. The coating method comprises at least the steps of applying a composition containing a compound (a) and a polymer that are second insulating layer components, and a solvent, or a composition containing a polymer having, in its molecular structure, the remaining group after removing some hydrogen atoms from $R^1$, $R^2$, $R^3$, or $R^4$ in the compound (a) or the remaining group after removing some hydrogen atoms from the carbon-carbon double bond or the conjugated system in the compound (a), and a solvent; and drying the coating film.

Specific and preferred coating methods include spin coating, blade coating, slit die coating, screen printing, bar coating, molding, print transferring, dip coating, inkjet printing, and drop casting methods. Preferably, the coating method is selected from them dependent on the desired coating characteristics, such as coating thickness control and orientation control.

In formation of a second insulating layer using a coating method, a preferred but non-limiting solvent for dissolving a polymer to be contained in the second insulating layer is an organic solvent. Specific examples of the solvent include ether such as ethylene glycol monomethyl ether, ethylene glycol monoethyl ether, propylene glycol monomethyl ether, propylene glycol monoethyl ether, propylene glycol mono-n-butyl ether, propylene glycol mono-t-butyl ether, ethylene glycol dimethyl ether, ethylene glycol diethyl ether, ethylene glycol dibutyl ether, or diethylene glycol ethyl methyl ether; ester such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, or butyl lactate; ketone such as acetone, methyl ethyl ketone, methyl propyl ketone, methyl butyl ketone, methyl isobutyl ketone, cyclopentanone, 2-heptanone, or γ-butyrolactone; alcohol such as butyl alcohol, isobutyl alcohol, pentanol, 4-methyl-2-pentanol, 3-methyl-2-butanol, 3-methyl-3-methoxybutanol, or diacetone alcohol; amide such as N,N-dimethylformamide, or N-methylpyrrolidone; aromatic hydrocarbon such as toluene, or xylene; and hydrocarbon such as hexane, or decahydronaphthalene.

Two or more of these solvents may be used. Especially preferably, the composition contains a solvent with a boiling point of 110° C. to 250° C. at 1 atm. When the solvent has a boiling point of 110° C. or higher, volatilization of the solvent during solution coating is reduced, resulting in good coating properties. When the solvent has a boiling point of 250° C. or lower, the amount of the solvent to be left in the insulating film is reduced, providing a second insulating layer having better heat resistance and chemical resistance.

The formed coating film may also be subjected to annealing treatment or hot air drying under atmospheric conditions, reduced pressure, or an inert gas atmosphere such as nitrogen or argon. Specifically, the annealing condition may be at 50° C. to 150° C. for 3 minutes to 30 minutes under a nitrogen atmosphere. Such a drying process can ensure that the coating film is sufficiently dried when it is not.

Figure 3B:
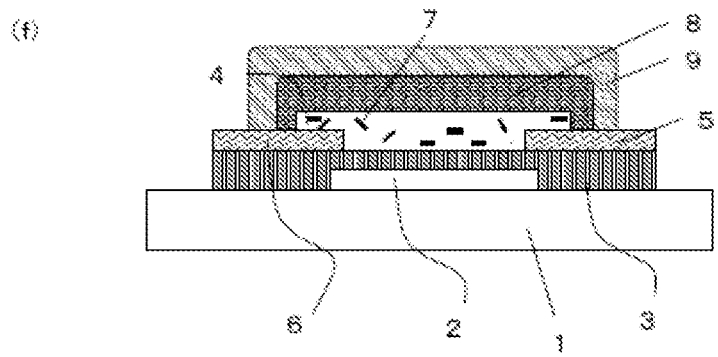
FIG. 3B is a sectional view showing a process for manufacturing an n-type semiconductor element according to Embodiment 1 of the present invention.

A protective layer 9 may be formed, as necessary, to cover the second insulating layer, as shown in FIG. 3B (f).

<Wireless Communication Device>

Next, a wireless communication device having the n-type semiconductor element according to embodiments of the present invention will be described. The wireless communication device is a device, such as an RFID tag, that performs electrical communication by receiving carrier waves transmitted from an antenna mounted on a reader/writer and transmitting signals.

As a specific and exemplary operation, an antenna of an RFID tag receives a wireless signal transmitted from an antenna mounted on a reader/writer. An AC current is then generated in response to the signal and converted into a DC current by a rectifier circuit, which powers the RFID tag. Then, the powered RFID tag receives a command from the wireless signal, operating in response to the command. Thereafter, the resulting response to the command is then transmitted from the antenna of the RFID tag to the antenna of the reader/writer as a wireless signal. The operation in response to a command is performed via at least a known demodulation circuit, an operation controlling logic circuit, and a modulation circuit.

Figure 4:
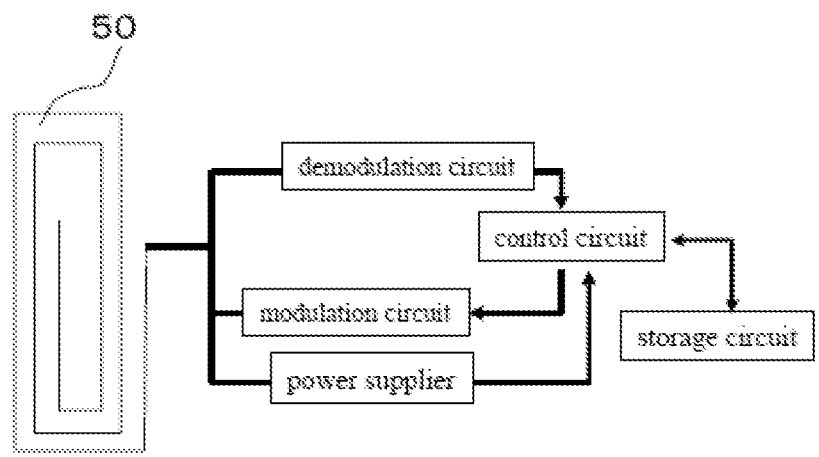
FIG. 4 is a block diagram illustrating one example of a wireless communication device using an n-type semiconductor element in one embodiment of the present invention.

The wireless communication device according to embodiments of the present invention comprises at least the n-type semiconductor element described above, and an antenna. A more specific structure of the wireless communication device according to embodiments of the present invention is, for example, as shown in FIG. 4. The wireless communication device comprises a power supplier that rectifies an external modulated wave signal received by an antenna 50 and supplies power to other units; a demodulator circuit that demodulates the modulated wave signal and sends it to a control circuit; a modulation circuit that modulates the data received from the control circuit and sends it to the antenna; and the control circuit that writes the data demodulated by the demodulator circuit to a storage circuit and/or reads a data from the storage circuit and sends it to the modulation circuit, which circuits are electrically connected to each other.

The demodulator circuit, the control circuit, the modulation circuit, and the storage circuit comprise the n-type semiconductor element described above, and may further comprise a capacitor, a resistance element, and a diode. The power supplier described above comprises a capacitor and a diode.

The antenna, the capacitor, the resistance element, and the diode may be those that are commonly used, and may apply any materials and shapes. In addition, the material for electrically connecting the components described above may be any electrically conductive material that can be commonly used. The components may be connected in any way that can cause an electric conduction. The joints between the components may have an arbitrary width and thickness.

<Merchandise Tag>

Next, a merchandise tag comprising the wireless communication device according to embodiments of the present invention will be described. The merchandise tag comprises, for example, a base, and the wireless communication device described above covered with the base.

The base is formed of, for example, a non-metallic material, such as paper, in a flat shape. For example, the base has a structure with two sheets of flat-shaped paper laminated together, between which the wireless communication device is placed. The storage circuit in the wireless storage device stores, for example, individual identification information for individually identifying products in advance.

A wireless communication is performed between the merchandise tag and a reader/writer. The term "reader/writer" refers to a device for wirelessly reading and writing data in communication with merchandise tags. The reader/writer communicates data with merchandise tags during distribution or in payment of products. The reader/writer is, for example, portable or fixed in the case of installation in cash registers. A known reader/writer can be used for the merchandise tag according to embodiments of the present invention.

The merchandise tag according to embodiments of the present invention has a function for sending back identification information. This function is for a merchandise tag to wirelessly send back its own stored individual identification information when it receives a command requesting the transmission of the individual identification information from a given reader/writer. In response to a single command from a reader/writer, many merchandise tags send the individual identification information stored in the tags. For example, this function allows many products to be simultaneously identified in a product checkout counter in a non-contact way. Therefore, easier and more rapid payment processing than that using identification with bar codes can be provided.

In addition, for example, a reader/writer can send product information read from a merchandise tag to a POS (Point of sale system) terminal in payment for the product. This function also allows a POS terminal to register the sale of a product identified by the product information, thus facilitating and speeding up inventory management.

EXAMPLES

The present invention will be described below in more detail based on the examples. It should be noted that the present invention is not limited to the examples described below.

The molecular weight of a polymer was measured as below. A sample was filtered through a membrane filter with a pore size of 0.45 μm, and the molecular weight was determined by GPC (GEL PERMEATION CHROMATOGRAPHY, HLC-8220GPC, Tosoh Corporation) (eluent: chloroform or tetrahydrofuran, flow rate: 0.4 mL/min) in terms of a polystyrene standard sample.

The water absorption of the polymer was determined by immersing 10 g of a pellet sample in water at 23° C. for one week and calculating the mass change as a percentage of the original mass, according to JIS K 7209 2000 (Plastics—Determination of water absorption).

Semiconductor Solution Preparation Example 1; Semiconductor Solution A

A compound [60] was synthesized by following the steps shown in Formula 1, as described in "Semiconductor Solution Preparation Example 2" in WO2017/130836.

Formula I
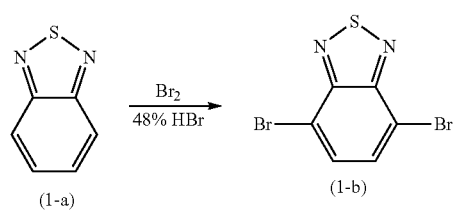
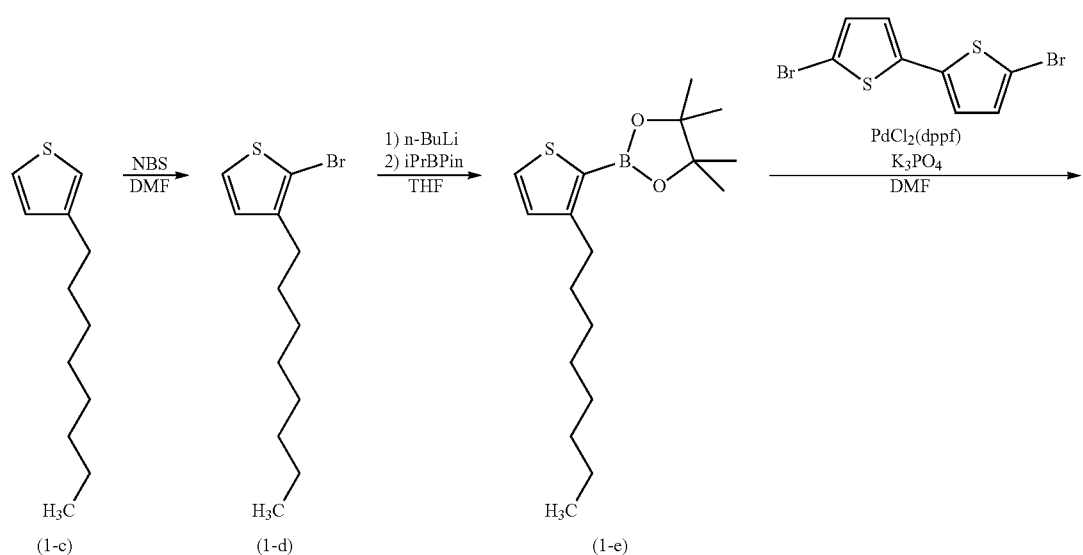
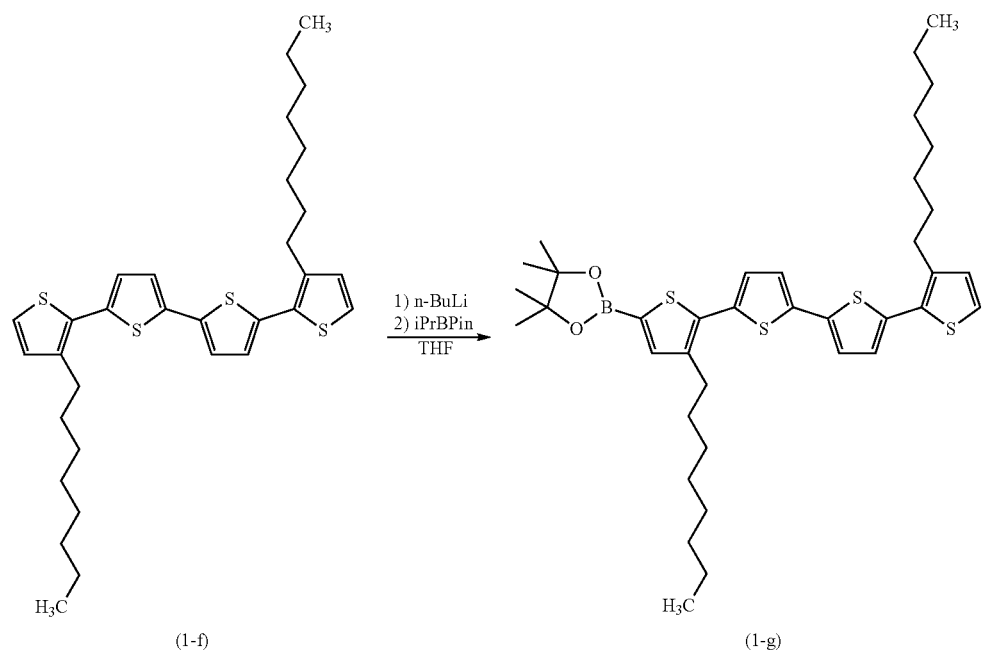

-continued
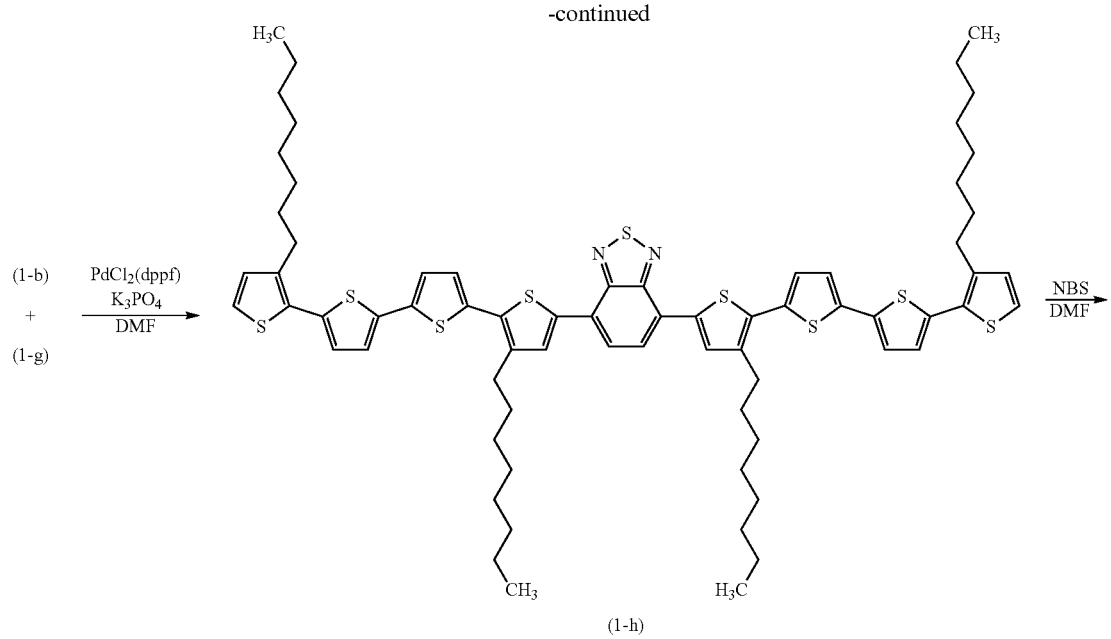
(1-h)
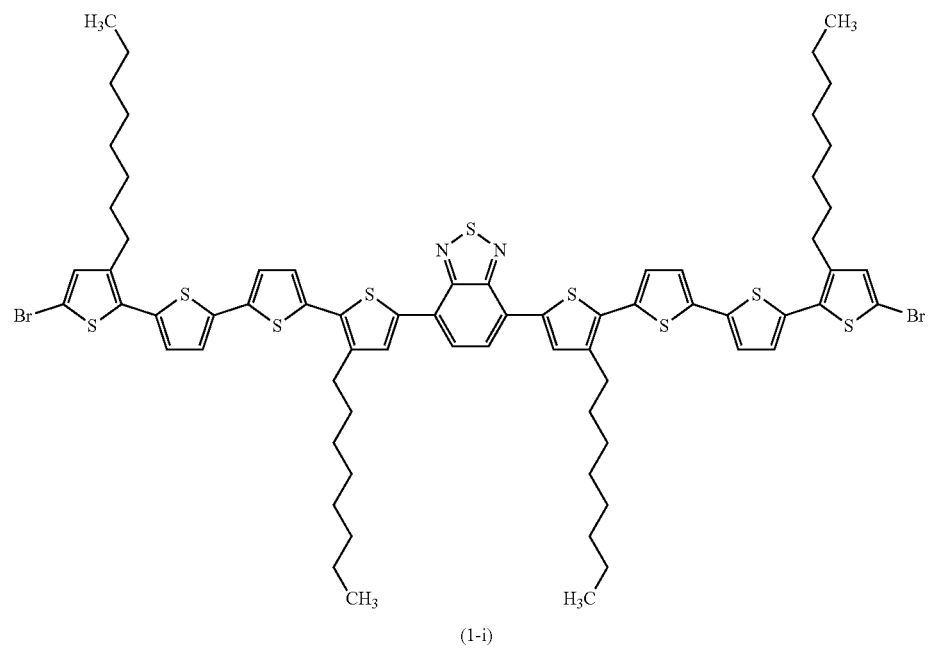
(1-i)
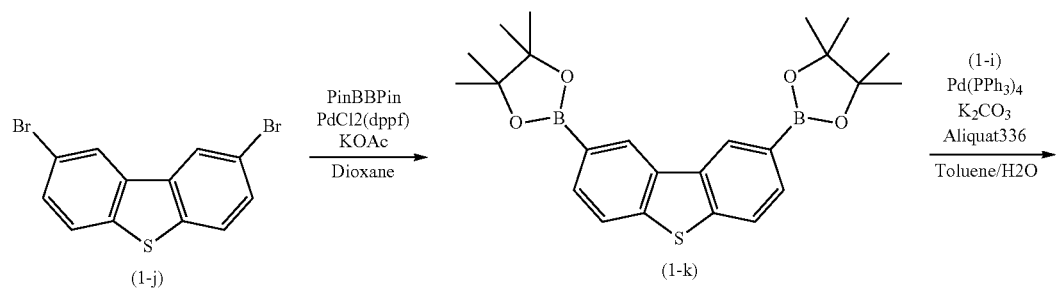

-continued

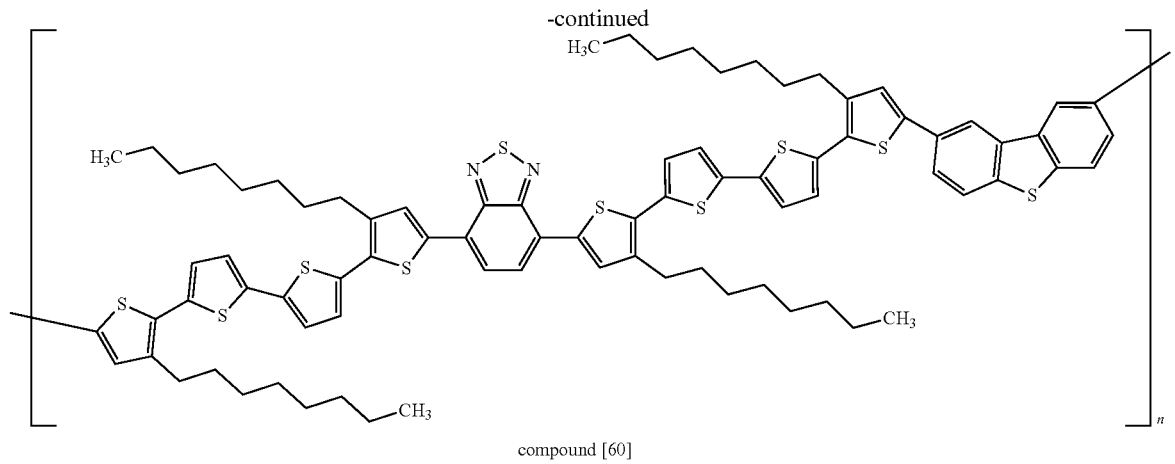

compound [60]

The molecular weight of the compound [60] was measured by the method as described above, and the weight average molecular weight was 4367, the number average molecular weight was 3475, and the degree of polymerization n was 3.1.

To a solution of 2.0 mg of the compound [60] in 10 mL of chloroform was added 1.0 mg of CNT1 (single-walled CNT, 95% purity, produced by CNI). The mixture was ultrasonically stirred using an ultrasonic homogenizer (VCX-500 produced by Tokyo Rikakikai Co. Ltd.) at 20% output on ice for 4 hours to obtain CNT Dispersion A (the concentration of the CNT complex in the solvent is 0.96 g/L).

Then, Semiconductor Solution for forming a semiconductor layer was prepared. The CNT Dispersion A was filtered through a membrane filter (Millipore Omnipore membrane, pore size: 10 μm, diameter: 25 mm) to remove a CNT complex having a length of 10 μm or more. After 5 mL of orthodichlorobenzene (o-DCB, produced by Wako Pure Chemical Industries, Ltd.) was added to the obtained filtrate, chloroform that was a solvent having a low boiling point was evaporated using a rotary evaporator to obtain CNT dispersion B. Then, 3 mL of o-DCB was added to 1 mL of the CNT dispersion B to obtain Semiconductor Solution A (the concentration of the CNT complex in the solvent was 0.03 g/L).

Composition Preparation Example 1; Gate Insulating Layer Solution A

First, 61.29 g (0.45 mole) of methyltrimethoxysilane, 12.31 g (0.05 mole) of 2-(3,4-epoxycyclohexyl)ethyltrimethoxysilane, and 99.15 g (0.5 mole) of phenyltrimethoxysilane were dissolved in 203.36 g of propylene glycol monobutyl ether (boiling point: 170° C.). Then, 54.90 g of water, and 0.864 g of phosphoric acid were added to the solution with stirring. The obtained solution was heated at a bath temperature of 105° C. for 2 hours, and the internal temperature was raised to 90° C. to evaporate components mainly containing methanol as byproducts. The resulting product was then heated at a bath temperature of 130° C. for 2.0 hours, and the internal temperature was raised to 118° C. to evaporate components mainly containing water and propylene glycol monobutyl ether. Thereafter, the resulting product was cooled to room temperature to obtain Polysiloxane Solution A with a solid content concentration of 26.0% by weight. The molecular weight of the obtained polysiloxane was measured by the method as described above, and the weight average molecular weight was 6000.

Then, 10 g of the obtained Polysiloxane Solution A, 13.0 g of aluminum bis(ethylacetoacetate)mono(2,4-pentanedionato) (product name "Alumichelate D", Kawaken Fine Chemicals Co., Ltd., hereinafter referred to as "Alumichelate D"), and 42.0 g of propylene glycol monoethyl ether acetate (hereinafter, referred to as "PGMEA") were mixed with stirring at room temperature for 2 hours to obtain Gate Insulating Layer Solution A. The content of the polysiloxane in the solution was 20 parts by weight with respect to 100 parts by weight of Alumichelate D.

Composition Preparation Example 2; Second Insulating Layer Preparation Solution A First, 2.5 g of polymethyl methacrylate (FUJIFILM Wako Pure Chemical Corporation) was dissolved in 7.5 g of N,N-dimethylformamide to prepare Polymer Solution A. Then, 1 g of 1,4-phenylenediamine (Tokyo Chemical Industry Co., Ltd.) was dissolved in 9.0 g of N,N-dimethylformamide to prepare Compound Solution A. To 0.68 g of Polymer Solution A was added 0.30 g of Compound Solution A, to obtain a second insulating layer preparation solution A.

Composition Preparation Example 3; Second Insulating Layer Preparation Solution B A second insulating layer preparation solution B was obtained in the same manner as in Composition Preparation Example 2 except that 1,4-phenylenediamine was changed to 3,3',5,5'-tetramethylbenzidine (Tokyo Chemical Industry Co., Ltd.).

Composition Preparation Example 4; Second Insulating Layer Preparation Solution C A second insulating layer preparation solution C was obtained in the same manner as in Composition Preparation Example 2 except that 1,4-phenylenediamine was changed to N,N-dimethyl-1,4-phenylenediamine (Tokyo Chemical Industry Co., Ltd.).

Composition Preparation Example 5; Second Insulating Layer Preparation Solution D A second insulating layer preparation solution D was obtained in the same manner as in Composition Preparation Example 2 except that 1,4-phenylenediamine was changed to 5,10-dihydro-5,10-dimethylphenazine (Tokyo Chemical Industry Co., Ltd.).

Composition Preparation Example 6; Second Insulating Layer Preparation Solution E A second insulating layer preparation solution E was obtained in the same manner as in Composition Preparation Example 2 except that 1,4-phenylenediamine was changed to 4-((2-dimethylamino)vinyl)-N,N-dimethylaniline.

Composition Preparation Example 7; Second Insulating Layer Preparation Solution F A second insulating layer preparation solution F was obtained in the same manner as in Composition Preparation Example 2 except that 1,4-phenylenediamine was changed to N,N-bis(methoxymethyl)-N',N'-dimethyl-1,4-phenylenediamine.

Composition Preparation Example 8; Second Insulating Layer Preparation Solution G A second insulating layer preparation solution G was obtained in the same manner as in Composition Preparation Example 2 except that 1,4-phenylenediamine was changed to N,N,N',N'-tetramethylbenzidine (Tokyo Chemical Industry Co., Ltd.).

Composition Preparation Example 9; Second Insulating Layer Preparation Solution H A second insulating layer preparation solution H was obtained in the same manner as in Composition Preparation Example 2 except that 1,4-phenylenediamine was changed to N,N,N',N'-tetramethyl-1,4-phenylenediamine (FUJIFILM Wako Pure Chemical Corporation).

Composition Preparation Example 10; Second Insulating Layer Preparation Solution I A second insulating layer preparation solution I was obtained in the same manner as in Composition Preparation Example 9 except that polymethyl methacrylate was changed to polystyrene (FUJIFILM Wako Pure Chemical Corporation).

Composition Preparation Example 11; Second Insulating Layer Preparation Solution J First, 2.5 g of cyclo-olefin polymer (Zeon Corporation) was dissolved in 7.5 g of decahydronaphthalene (FUJIFILM Wako Pure Chemical Corporation) to prepare Polymer Solution B. Then, 1 g of N,N,N',N'-tetramethyl-1,4-phenylenediamine was dissolved in 9.0 g of toluene (FUJIFILM Wako Pure Chemical Corporation) to prepare Compound Solution B. To 0.68 g of Polymer Solution B was added 0.30 g of Compound Solution B, to obtain a second insulating layer preparation solution J.

Composition Preparation Example 12; Second Insulating Layer Preparation Solution K A second insulating layer preparation solution K was obtained in the same manner as in Composition Preparation Example 9 except that polymethyl methacrylate was changed to an ester group-containing olefin resin (ArtonF4520, JSR Corporation).

Composition Preparation Example 13; Second Insulating Layer Preparation Solution L A second insulating layer preparation solution L was obtained in the same manner as in Composition Preparation Example 2 except that 1,4-phenylenediamine was changed to aniline (Tokyo Chemical Industry Co., Ltd.).

Composition Preparation Example 14; Second Insulating Layer Preparation Solution M A second insulating layer preparation solution M was obtained in the same manner as in Composition Preparation Example 2 except that 1,4-phenylenediamine was changed to 4'-aminoacetanilide (Tokyo Chemical Industry Co., Ltd.).

Composition Preparation Example 15; Second Insulating Layer Preparation Solution N A second insulating layer preparation solution N was obtained in the same manner as in Composition Preparation Example 2 except that 1,4-phenylenediamine was changed to 4,4'-bis(dimethylamino)triphenylmethane (Tokyo Chemical Industry Co., Ltd.).

Composition Preparation Example 16; Second Insulating Layer Preparation Solution O First, 2.5 g of polymethyl methacrylate was dissolved in 7.5 g of toluene to prepare Polymer Solution C. Then, 0.060 g of 4,4'-bis(diphenylamino)biphenyl (Tokyo Chemical Industry Co., Ltd.) was dissolved in 0.94 g of chloroform (FUJIFILM Wako Pure Chemical Corporation) to prepare Compound Solution C. To 0.68 g of Polymer Solution C was added 0.50 g of Compound Solution C, to obtain a second insulating layer preparation solution O.

Composition Preparation Example 17; Second Insulating Layer Preparation Solution P First, 1.5 g of N,N,N',N'-tetramethyl-1,4-phenylenediamine was dissolved in 8.5 g of N,N-dimethylformamide to obtain a second insulating layer preparation solution P.

Composition Preparation Example 18; Second Insulating Layer Preparation Solution Q A second insulating layer preparation solution Q was obtained in the same manner as in Composition Preparation Example 13 except that polymethyl methacrylate was changed to polystyrene (FUJIFILM Wako Pure Chemical Corporation).

Composition Preparation Example 19; Second Insulating Layer Preparation Solution R First, 5 g of polyvinyl acetate (FUJIFILM Wako Pure Chemical Corporation) was dissolved in 45 g of methanol. Then, 0.41 mL of 1M aqueous sodium hydroxide solution was added and the mixture was stirred at 30° C. for 50 minutes. The obtained solution was added to 150 mL of 2.7 mM acetic acid, and the precipitate was collected by filtration. The obtained precipitate was washed well with water and dried to obtain Polymer R (partially saponified polyvinyl acetate). A second insulating layer preparation solution R was obtained in the same manner as in Composition Preparation Example 9 except that polymethyl methacrylate was changed to Polymer R.

Example 1

A semiconductor element having a structure shown in FIG. 1 was prepared. A glass substrate 1 (0.7 mm thickness) was coated with 5 nm thickness of chromium and 50 nm thickness of gold through a mask by resistance heating vacuum deposition to form a gate electrode 2. The substrate was then spin-coated (at 2000 rpm for 30 sec) with the gate insulating layer solution A, and heated at 200° C. for 1 hour under a nitrogen gas flow to form a gate insulating layer 3 having a thickness of 600 nm. Then, 50 nm thickness of gold was coated through a mask by resistance heating vacuum deposition to form a source electrode 5 and a drain electrode 6. Then, 1 μL of the semiconductor solution A was added dropwise between the source electrode 5 and the drain electrode 6, dried in the air at 30° C. for 10 minutes, and heated on a hot plate at 150° C. for 30 minutes under a nitrogen gas flow to form a semiconductor layer 4. Then, 5 μL of the second insulating layer preparation solution A was added dropwise on and cover the semiconductor layer 4, and heated at 110° C. for 30 minutes under a nitrogen gas flow to form a second insulating layer 8. Thus, an n-type semiconductor element was obtained. The semiconductor element had a width between the source and drain electrodes (channel width) of 200 μm, and an interval between the source and drain electrodes (channel length) of 20 μm.

Next, the source-drain current (Id)-source-drain voltage (Vsd) characteristics was determined as the gate voltage (Vg) was changed. The determination was performed using 4200-SCS semiconductor characterization system (Keithley Instruments, Inc.) in the atmosphere. The mobility in the linear region was determined based on the change in the Id value at Vsd=+5 V when Vg change=+30V to −30V. In addition, after the semiconductor element was stored for 500 hours under atmospheric conditions, the mobility was determined in the same manner. The results are shown in Table 1.

Example 2

A semiconductor element was produced in the same manner as in Example 1 except that the second insulating layer preparation solution B was used instead of the second insulating layer preparation solution A, and the mobility was evaluated.

Example 3

A semiconductor element was produced in the same manner as in Example 1 except that the second insulating layer preparation solution C was used instead of the second insulating layer preparation solution A, and the mobility was evaluated.

Example 4

A semiconductor element was produced in the same manner as in Example 1 except that the second insulating layer preparation solution D was used instead of the second insulating layer preparation solution A, and the mobility was evaluated.

Example 5

A semiconductor element was produced in the same manner as in Example 1 except that the second insulating layer preparation solution E was used instead of the second insulating layer preparation solution A, and the mobility was evaluated.

Example 6

A semiconductor element was produced in the same manner as in Example 1 except that the second insulating layer preparation solution F was used instead of the second insulating layer preparation solution A, and the mobility was evaluated.

Example 7

A semiconductor element was produced in the same manner as in Example 1 except that the second insulating layer preparation solution G was used instead of the second insulating layer preparation solution A, and the mobility was evaluated.

Example 8

A semiconductor element was produced in the same manner as in Example 1 except that the second insulating layer preparation solution H was used instead of the second insulating layer preparation solution A, and the mobility was evaluated.

Example 9

A semiconductor element was produced in the same manner as in Example 1 except that the second insulating layer preparation solution I was used instead of the second insulating layer preparation solution A, and the mobility was evaluated.

Example 10

A semiconductor element was produced in the same manner as in Example 1 except that the second insulating layer preparation solution J was used instead of the second insulating layer preparation solution A, and the mobility was evaluated.

Example 11

A semiconductor element was produced in the same manner as in Example 1 except that the second insulating layer preparation solution K was used instead of the second insulating layer preparation solution A, and the mobility was evaluated.

Example 12

A semiconductor element was produced in the same manner as in Example 1 except that the second insulating layer preparation solution R was used instead of the second insulating layer preparation solution A, and the mobility was evaluated.

Comparative Example 1

A semiconductor element was produced in the same manner as in Example 1 except that the second insulating layer preparation solution L was used instead of the second insulating layer preparation solution A, and the mobility was evaluated. Poor n-type semiconductor characteristics was obtained.

Comparative Example 2

A semiconductor element was produced in the same manner as in Example 1 except that the second insulating layer preparation solution M was used instead of the second insulating layer preparation solution A, and the mobility was evaluated. Poor n-type semiconductor characteristics was obtained.

Comparative Example 3

A semiconductor element was produced in the same manner as in Example 1 except that the second insulating layer preparation solution N was used instead of the second insulating layer preparation solution A, and the mobility was evaluated. Poor n-type semiconductor characteristics was obtained.

Comparative Example 4

A semiconductor element was produced in the same manner as in Example 1 except that the second insulating layer preparation solution O was used instead of the second insulating layer preparation solution A, and the mobility was evaluated. Poor n-type semiconductor characteristics was obtained.

Comparative Example 5

A semiconductor element was produced in the same manner as in Example 1 except that the second insulating layer preparation solution P was used instead of the second insulating layer preparation solution A, and the mobility was evaluated. No n-type semiconductor characteristics was obtained.

Comparative Example 6

A semiconductor element was produced in the same manner as in Example 1 except that the second insulating layer preparation solution Q was used instead of the second insulating layer preparation solution A, and the mobility was evaluated. Poor n-type semiconductor characteristics was obtained.

TABLE 1

| | | Second Insulating Layer | | Water Absorption | Mobility [cm$^2$/Vs] | |
|---|---|---|---|---|---|---|
| | Solution | Compound (a) | Polymer (b) | [wt %] | 0 hour | 500 hours |
| Ex. 1 | A | 1,4-phenylenediamine | PMMA | 0.4 | 1.12 | 1.00 |
| Ex. 2 | B | 3,3',5,5'-tetramethylbenzidine | PMMA | 0.4 | 1.13 | 1.01 |
| Ex. 3 | C | N,N-dimethyl-1,4-phenylenediamine | PMMA | 0.4 | 1.20 | 1.12 |
| Ex. 4 | D | 5,10-dihydro-5,10-dimethylphenazine | PMMA | 0.4 | 1.18 | 1.08 |
| Ex. 5 | E | 4-((2-dimethylamino)vinyl)-N,N-dimethylaniline | PMMA | 0.4 | 1.00 | 0.92 |
| Ex. 6 | F | N,N-bis(methoxymethyl)-N',N'-dimethyl-1,4-phenylenediamine | PMMA | 0.4 | 1.29 | 1.21 |
| Ex. 7 | G | N,N,N',N'-tetramethylbenzidine | PMMA | 0.4 | 1.30 | 1.22 |
| Ex. 8 | H | N,N,N',N'-tetramethyl-1,4-phenylenediamine | PMMA | 0.4 | 1.50 | 1.42 |
| Ex. 9 | I | N,N,N',N'-tetramethyl-1,4-phenylenediamine | PS | 0.05 | 1.02 | 0.95 |
| Ex. 10 | J | N,N,N',N'-tetramethyl-1,4-phenylenediamine | cyclo-olefin polymer | 0.01 | 0.97 | 0.92 |
| Ex. 11 | K | N,N,N',N'-tetramethyl-1,4-phenylenediamine | ester group-containing olefin resin | 0.1 | 1.50 | 1.45 |
| Ex. 12 | R | N,N,N',N'-tetramethyl-1,4-phenylenediamine | partially saponified polyvinyl acetate | 0.45 | 1.25 | 1.17 |
| Com. Ex. 1 | L | aniline | PMMA | 0.4 | 0.65 | 0.49 |
| Com. Ex. 2 | M | 4'-aminoacetanilide | PMMA | 0.4 | 0.58 | 0.45 |
| Com. Ex. 3 | N | 4,4'-bis(dimethylamino)triphenylmethane | PMMA | 0.4 | 0.68 | 0.50 |
| Com. Ex. 4 | O | 4,4'-bis(diphenylamino)biphenyl | PMMA | 0.4 | 0.80 | 0.55 |
| Com. Ex. 5 | P | N,N,N',N'-tetramethyl-1,4-phenylenediamine | none | — | 0.01 | — |
| Com. Ex. 6 | Q | aniline | PS | 0.4 | 0.46 | 0.35 |

(*) PMMA: polymethylmethacrylate
(*) PS: polystyrene

REFERENCE SIGNS LIST 1 substrate
2 gate electrode
3 gate insulating layer
4 semiconductor layer
5 source electrode
6 drain electrode 7 nanocarbon
8 second insulating layer
9 protective layer
50 antenna

The invention claimed is:

1. An n-type semiconductor element, comprising:
a substrate;
a source electrode, a drain electrode, and a gate electrode;
a semiconductor layer in contact with both the source electrode and the drain electrode;
a gate insulating layer for insulating the semiconductor layer from the gate electrode; and
a second insulating layer positioned on the opposite side of the semiconductor layer from the gate insulating layer and in contact with the semiconductor layer;
wherein the semiconductor layer contains nanocarbon,
wherein the second insulating layer contains:
A. (a) a compound having one carbon-carbon double bond or one conjugated system directly bound to at least one group represented by general formula (1) and at least one group represented by general formula (2) (hereinafter, referred to as "compound (a)"); and
(b) a polymer; or
B. a polymer having, in its molecular structure, the remaining group after removing some hydrogen atoms from $R^1$, $R^2$, $R^3$, or $R^4$ in the compound (a), or the remaining group after removing some hydrogen atoms from the carbon-carbon double bond or the conjugated system in the compound (a), where, in this option B, all of the groups represented by general formulae (1) and (2) contained in the compound (a) are tertiary amines,

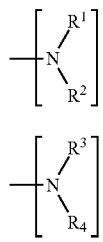

wherein,
$R^1$ is selected from hydrogen, alkyl, and cycloalkyl;
$R^2$ to $R^4$ each is independently selected from hydrogen, alkyl, cycloalkyl, alkoxyalkyl, alkenyl, cycloalkenyl, alkynyl, aryl, and heteroaryl;
arbitrary two of $R^1$ to $R^4$ are optionally taken together to form a ring structure;
when two or more groups represented by general formula (1) or (2) are present, then two or more $R^1$, $R^2$, $R^3$, and $R^4$ present in the groups represented by general formulae (1) and (2) are the same or different.

2. The n-type semiconductor element according to claim 1, wherein the compound (a) has an aromatic ring as the conjugated system.

3. The n-type semiconductor element according to claim 1, wherein the compound (a) has a conjugated system bound to groups represented by general formulae (1) and (2), the structure of which comprises a structure derived from arylenediamine or heteroarylenediamine.

4. The n-type semiconductor element according to claim 1, wherein all of the groups represented by general formulae (1) and (2) contained in the compound (a) are tertiary amines.

5. The n-type semiconductor element according to claim 1, wherein at least one group represented by general formula (1) directly bound to a carbon-carbon double bond or one conjugated system in the compound (a) has $R^1$ and $R^2$ selected from the group consisting of alkyl and cycloalkyl.

6. The n-type semiconductor element according to claim 1, wherein the polymer contains a carbon atom and a heteroatom.

7. The n-type semiconductor element according to claim 1, wherein the polymer has an ester bonding.

8. The n-type semiconductor element according to claim 1, wherein the water absorption of the polymer is 0.5% by weight or less.

9. The n-type semiconductor element according to claim 1, wherein the nanocarbon is carbon nanotube.

10. The n-type semiconductor element according to claim 9, wherein the carbon nanotubes have a conjugated polymer attached to at least a portion of the surface thereof.

11. A method of manufacturing the n-type semiconductor element according to claim 1, the method comprising the steps of
forming a second insulating layer by applying:
A. a composition containing a compound (a), a polymer, and a solvent; or
B. a polymer having, in its molecular structure, the remaining group after removing some hydrogen atoms from $R^1$, $R^2$, $R^3$, or $R^4$ in the compound (a), or the remaining group after removing some hydrogen atoms from the carbon-carbon double bond or the conjugated system in the compound (a), where, in this option B, all of the groups represented by general formulae (1) and (2) contained in the compound (a) are tertiary amines, and a solvent; and
drying the applied composition.

12. A method of manufacturing the n-type semiconductor element according to claim 1, the method comprising the step of forming a semiconductor layer by applying a solution containing a nanocarbon and a solvent; and drying the applied solution.

13. A wireless communication device, comprising at least the n-type semiconductor element according to claim 1, and an antenna.

14. A merchandise tag, comprising the wireless communication device according to claim 13.

* * * * *